(12) United States Patent
Li et al.

(10) Patent No.: US 11,791,813 B2
(45) Date of Patent: Oct. 17, 2023

(54) PWM GENERATION CIRCUIT, PROCESSING CIRCUIT AND CHIP

(71) Applicant: AMICRO SEMICONDUCTOR CO., LTD., Guangdong (CN)

(72) Inventors: Zhanghui Li, Guangdong (CN); Zaisheng He, Guangdong (CN); Dengke Xu, Guangdong (CN)

(73) Assignee: AMICRO SEMICONDUCTOR CO., LTD., Guangdong (CN)

( * ) Notice: Subject to any disclaimer, the term of this patent is extended or adjusted under 35 U.S.C. 154(b) by 384 days.

(21) Appl. No.: 17/312,402

(22) PCT Filed: Nov. 11, 2019

(86) PCT No.: PCT/CN2019/117140
§ 371 (c)(1),
(2) Date: Jun. 10, 2021

(87) PCT Pub. No.: WO2020/119360
PCT Pub. Date: Jun. 18, 2020

(65) Prior Publication Data
US 2022/0069814 A1    Mar. 3, 2022

(30) Foreign Application Priority Data

Dec. 10, 2018 (CN) .......................... 201811501937.1

(51) Int. Cl.
*H03K 7/08* (2006.01)
*H02P 7/29* (2016.01)

(52) U.S. Cl.
CPC ............ *H03K 7/08* (2013.01); *H02P 7/2913* (2013.01)

(58) Field of Classification Search
CPC .................................. H02P 7/2913; H03K 7/08
See application file for complete search history.

(56) References Cited

U.S. PATENT DOCUMENTS

| 5,663,667 A | * | 9/1997 | Blum | ................ H02M 3/33507 327/134 |
| 8,139,385 B2 | * | 3/2012 | Furuchi | ............. H02M 7/53873 363/41 |
| 8,816,621 B2 | * | 8/2014 | Minami | ................... H03K 7/08 318/400.11 |

(Continued)

FOREIGN PATENT DOCUMENTS

| CN | 103493349 A | 1/2014 |
| CN | 103762964 A | 4/2014 |

(Continued)

*Primary Examiner* — Thai T Dinh
(74) *Attorney, Agent, or Firm* — Gang Yu

(57) ABSTRACT

Disclosed are a Pulse Width Modulation (PWM) generation circuit, a processing circuit and a chip. The PWM generation circuit is used for controlling a rotation speed of an external motor system. The PWM generation circuit includes a second clock prescaler and a PWM signal generator. A frequency division output end of the second clock prescaler is connected to a data input end of the PWM signal generator. The PWM signal generator includes an output frequency divider and a comparator. A clock output end of the output frequency divider is connected to a comparison input end of the comparator. By means of the technical solution, PWM signals with different duty ratios.

18 Claims, 2 Drawing Sheets

(56) References Cited

U.S. PATENT DOCUMENTS

| | | |
|---|---|---|
| 2010/0066425 A1 | 3/2010 | Hiraku |
| 2011/0007794 A1 | 1/2011 | Vromans |
| 2013/0069702 A1 | 3/2013 | Ogawa |
| 2018/0302078 A1 | 10/2018 | Kang |

FOREIGN PATENT DOCUMENTS

| | | |
|---|---|---|
| CN | 109361381 A | 2/2019 |
| EP | 3128375 A1 | 2/2017 |

* cited by examiner

PWM GENERATION CIRCUIT, PROCESSING CIRCUIT AND CHIP

CROSS-REFERENCE TO RELATED APPLICATIONS

The present disclosure takes the Chinese Patent Application No. 201811501937.1, filed on Dec. 10, 2018, and entitled " PWM generation circuit, processing circuit and chip", as the priority, the entire contents of which are incorporated herein by reference.

TECHNICAL FIELD

The present disclosure relates to the technical field of signal modulation, and in particular to a Pulse Width Modulation (PWM) generation circuit, a processing circuit and a chip.

BACKGROUND

PWM technologies have been widely used in industrial automation, robot, precision Numerically-Controlled (NC) machine tools, aerospace and many other fields. A servo motor control system needs to generate a PWM signal with a variable duty ratio to drive an Insulated Gate Bipolar Transistor (IGBT), Intelligent Power Module (IPM) and other power devices. In a motion control system of robots or NC machine tools, a position control instruction may be transmitted through the PWM signal with a variable frequency between a motion control card and a servo driver.

PWM and Pulse Frequency Modulation (PFM) are two control modes of a DC/DC switch. This type of technology is often used for control of some analog circuits or peripheral motors. As Integrated Circuits (IC) become more and more integrated, most PWM circuits on the market can be implemented in many ways, and some of which are implemented by peripheral devices, such as a square-wave oscillator or a single-limit comparator. In the architecture design of the existing PWM technology, an output PWM signal is controlled by a CPU time sequence, a software interrupt process is complex, and a lot of software resources are wasted.

SUMMARY

To overcome the above problems, the present disclosure provides a PWM generation circuit.

The PWM generation circuit, which is used for controlling a rotation speed of an external motor system, may include a second clock prescaler and a PWM signal generator. A frequency division output end of the second clock prescaler is connected to a data input end of the PWM signal generator. The PWM signal generator includes an output frequency divider and a comparator. A comparison input end of the comparator is connected to a clock output end of the output frequency divider, and the other comparison input end of the comparator is connected to a reference constant voltage source. An input end of the output frequency divider serves as the data input end of the PWM signal generator, and a signal output end of the comparator serves as a comparison result output end of the PWM generation circuit.

Furthermore, a frequency division coefficient of the second clock pre-divider is configurable.

A PWM signal processing circuit is provided, which is used for adjusting an external motor system and may include a PWM sampling and detection module and a PWM generation module. A clock input end of the PWM sampling and detection module is connected to the clock input end of the PWM generation module. The PWM sampling and detection module may include a filter, a step counting sub-module, a signal prescaler, a speed detector and a first clock prescaler. A signal input end of the filter serves as a PWM signal input end of the PWM sampling and detection module. The connection relationship in the PWM sampling and detection module is as follows: a signal output end of the filter is connected to both a data input end of the step counting sub-module and the clock input end of the signal prescaler, the clock output end of the signal prescaler is connected to the data input end of the speed detector, the clock input end of the speed detector is connected to the clock output end of the first clock prescaler, and a speed signal output end of the speed detector serves as the output end of the PWM sampling and detection module. The PWM generation module includes the PWM generation circuit. The comparison result output end of the PWM generation circuit serves as the comparison result output end of the PWM generation module.

Furthermore, the filter may include a first preset number of D flip-flops and a comparison output module, the first preset number of D flip-flops form a shift register of the first preset number of bits. Clock ends of the first preset number of D flip-flops are connected to the clock input end of the filter. Output ends Q of the first preset number of D flip-flops are respectively connected to the first preset number of data input ends of the comparison output module. The data input end of the shift register serves as the signal input end of the filter. The data output end of the comparison output module serves as the signal output end of the filter.

Furthermore, in the shift register, the output end of each D flip-flop, except the rightmost D flip-flop, is connected to the input end of the D flip-flop on the right, the output end of the rightmost D flip-flop is connected to a data input end of the comparison output module, and the input end of the leftmost D flip-flop serves as the data input end of the shift register.

Furthermore, in the shift register, the output end of each D flip-flop, except the leftmost D flip-flop, is connected to the input end of the D flip-flop on the left, the output end of the leftmost D flip-flop is connected to a data input end of the comparison output module, and the input end of the rightmost D flip-flop serves as the data input end of the shift register.

Furthermore, the first preset number is set to 6, so that the filter filters level jitter less than 5 clock cycles in an input PWM signal PWM_IN to be processed as burrs. The clock cycle is a pulse cycle of the jitter level of the PWM signal PWM_IN to be processed.

Furthermore, the step counting sub-module may include a step counter and a direction register. The output end of the direction register is connected to an enabling end of the step counter. A counting output end of the step counter serves as the output end of the step counting sub-module, and the counting input end of the step counter serves as the data input end of the step counting sub-module.

Furthermore, the speed detector may include a rising edge detection circuit, a pulse width counter and a median average module. The rising edge detection circuit includes a D flip-flop and an AND gate. The input end D of the D flip-flop is connected to an input end of the AND gate, and an inverse output end (of the D flip-flop is connected to another input end of the AND gate. The clock end of the pulse width counter is connected to the clock end of the D flip-flop. The rising edge detection circuit is connected to a reset end of the pulse width counter through the output end of the AND gate.

The data output end of the pulse width counter is connected to the data input end of the median average module. The output end of the median average module serves as the speed signal output end of the speed detector, and the input end of the rising edge detection circuit serves as the data input end of the speed detector.

Furthermore, the power of a bit width value of the pulse width counter of 2 is greater than a ratio of the signal frequency of the clock input end of the pulse width counter to the signal frequency of the input end D of the D flip-flop.

A chip is provided, which may include the processing circuit.

Compared with the traditional an output external sampling clock Clk is received through the PWM generation circuit, a PWM output signal PWM_OUT with a controllable duty ratio based on the sampling clock Clk is output to adjust the external motor system, a CPU is not required to participate in the regulation of frequency division operations, and the complexity of a software control process is reduced.

DETAILED DESCRIPTION OF THE EMBODIMENTS

Figure 1:
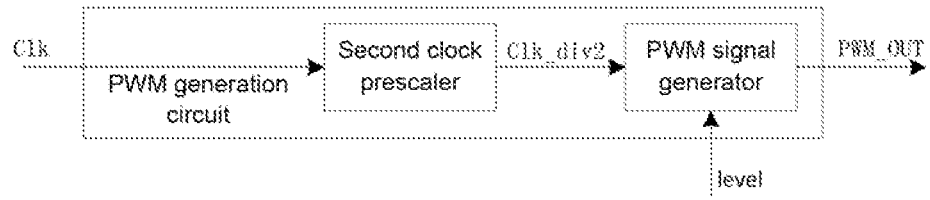
FIG. 1 is a structure diagram of a PWM generation circuit according to an embodiment of the disclosure.

The specific implementation modes of the disclosure are further explained below in combination with the accompanying drawings. As shown in FIG. 1, the embodiments of the disclosure provide a PWM generation circuit. As shown in FIG. 1, the PWM generation circuit includes a second clock prescaler and a PWM signal generator. The connection relationship in a module is that: the second clock prescaler is connected to a PWM sampling and detection module. Specifically, the second clock prescaler is connected to a first clock prescaler in the PWM sampling and detection module and is used for receiving a sampling clock Clk. The second clock prescaler is used for performing frequency division on the received sampling clock Clk to output a second frequency division clock signal Clk_div2. In the embodiments, a clock frequency of the second frequency division clock signal Clk_div2 may be 72 MHz, 40 MHz, 20 MHz or 10 MHz. The second clock prescaler is connected to the PWM signal generator and is used for transmitting the second frequency division clock signal Clk_div2 to the PWM signal generator. The PWM signal generator is used for receiving a reference level signal level and generating a PWM output signal PWM_OUT according to a result of comparison between a frequency division value of the second frequency division clock signal Clk_div2 and a level value of the reference level signal level. Specifically, the PWM signal generator performs frequency division on the second frequency division clock signal Clk_div2 through a counter, and then compares the level with frequency division reference level signal level. When the frequency division value of the second frequency division clock signal Clk_div2 is greater than the level value of the reference level signal level, the PWM output signal PWM_OUT is at high level; or else, the PWM output signal PWM_OUT is at low level. The PWM output signal PWM_OUT is output at a comparison result output end of the PWM generation circuit.

Figure 2:
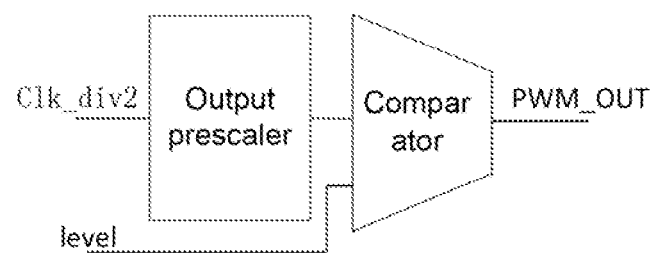
FIG. 2 is a circuit diagram of a PWM signal generator according to an embodiment of the disclosure.

As shown in FIG. 2, the PWM signal generator includes an output frequency divider and a comparator. A comparison input end of the comparator is connected to a clock output end of the output frequency divider, and another comparison input end of the comparator is connected to a reference constant voltage source, the input end of the output frequency divider serves as the data input end of the PWM signal generator. A signal output end of the comparator serves as the comparison result output end of the PWM generation circuit. The reference constant voltage source provides the reference level signal level. The output frequency divider is used for receiving the second frequency division clock signal Clk-div2 and performing frequency division on the second frequency division clock signal Clk-div2. In the embodiments of the disclosure, the output frequency divider includes a timer. The timer is configured as a 10 bit wide counter with a frequency division coefficient of 1024, so the output frequency divider performs 1024 frequency division on the second frequency division clock signal Clk-div2. When the clock frequency of the second frequency division clock signal Clk-div2 is 72 MHz, the frequency division value output by the output frequency divider is 72 MHz/1024 equal to 70 KHz, which may be used as the highest output frequency to be compared, so that the signal output by the PWM signal generator is a low frequency PWM output signal in KHz.

As shown in FIG. 2, because a comparison input end of the comparator is connected to the clock output end of the output frequency divider, and another comparison input end of the comparator is connected to the reference constant voltage source, the comparison input end of the comparator is connected to the frequency division value of the output frequency divider and the reference level signal level respectively to output the PWM output signal PWM_OUT at the corresponding level according to the result of comparison between the frequency division value of the second frequency division clock signal Clk_div2 and the level value of the reference level signal level. When the frequency division value is greater than the level value of the reference level signal level, the PWM output signal PWM_OUT is at high level. When the frequency division value is less than the level value of the reference level signal level, the PWM output signal PWM_OUT is at low level. Because the frequency division coefficient of the output frequency divider and the input second frequency division clock signal Clk_div2 are adjustable, a duty ratio of the PWM output signal PWM_OUT is controllable, at the same time, the PWM generation circuit also generates an interrupt output signal to assist the PWM sampling and detection module in controlling the rotation speed of an external motor system.

The embodiments of the disclosure also provide a PWM signal processing circuit. The processing circuit includes a PWM sampling and detection module and a PWM generation module. The PWM generation module includes the PWM generation circuit. In the embodiments of the disclosure, the connection relationship in the PWM generation circuit is equivalent to the connection relation in the PWM generation module.

The clock input end of the PWM sampling and detection module is connected to the clock input end of the PWM generation module. The PWM signal input end of the PWM sampling and detection module is used for capturing an input PWM signal PWM_IN to be processed. The clock input end of the PWM sampling and detection module is used for receiving a high frequency clock signal CLK_US output by an external system clock generator. In the embodiments of the disclosure, a frequency range of the PWM signal PWM_IN to be processed is greater than 32 Hz and less than 2 KHz. The high frequency clock signal CLK_US output by the external system clock generator is the clock signal with a cycle of 0.2 us, which plays a role of eliminating signal jitter through a counter with the corresponding precision. The PWM sampling and detection module is used for outputting a pulse speed signal speed based on the PWM signal to be processed and a corresponding pulse step signal for the external motor system as a feedback quantity. Relative to the traditional art, the application function of a PWM signal output circuit is expanded. The PWM generation module is used for receiving the sampling clock Clk output by the external system clock generator, and outputting the PWM output signal PWM-OUT a controllable duty ratio based on the sampling clock Clk. The PWM sampling and detection module and the PWM generation module are jointly connected to the sampling clock Clk. The sampling clock Clk may also be a bus clock on an external AHB bus, and the corresponding clock frequencies include 80 MHz, 40 MHz or 20 MHz, so that the PWM output signal PWM_OUT to meets the application requirements of various motor control systems. When the PWM sampling and detection module provides the pulse speed signal speed and the corresponding pulse step signal for the external motor system, the external motor system regulates according to the above sampling signal, specifically, it regulates the frequency of the output sampling clock Clk, the PWM signal PWM-IN to be processed and the high frequency clock signal CLK-US, and then controls the PWM generation module to output the PWM output signal PWM-OUT with the corresponding duty ratio, so as to complete the regulation and control of the rotation speed of the external motor system.

Figure 3:
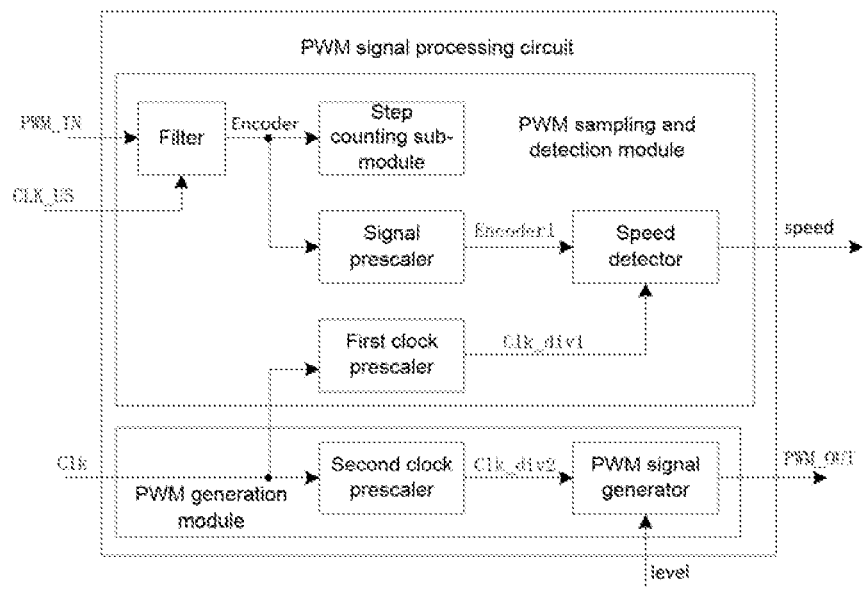
FIG. 3 is a structure diagram of a PWM signal processing circuit according to an embodiment of the disclosure.

As shown in FIG. 3, the PWM sampling and detection module includes a filter, a step counting sub-module, a signal prescaler, a speed detector and a first clock prescaler. A signal input end of the filter serves as the PWM signal input end of the PWM sampling and detection module. A speed signal output end of the speed detector serves as the output end of the PWM sampling and detection module. The connection relationship in the PWM sampling and detection module is that: a signal output end of the filter is connected to both a data input end of the step counting sub-module and the clock input end of the signal prescaler, the clock output end of the signal prescaler is connected to the data input end of the speed detector, the clock input end of the speed detector is connected to the clock output end of the first clock prescaler. The signal input end of the filter is used for capturing the input PWM signal PWM_IN to be processed. The clock input end of the filter receives the high frequency clock signal CLK_US output by the external system clock generator, and controls the filtering of the PWM signal PWM_IN to be processed under the driving of the high frequency clock signal CLK US, and then outputs a reference PWM signal Encoder from the signal output end of the filter.

Because the high frequency clock signal CLK_US may be configured, the filter may filter level jitter signals with different pulse widths in the PWM signal PWM_IN to be processed. The signal output end of the filter is connected to both the data input end of the step counting sub-module and the clock input end of the signal prescaler, and is used for transmitting the reference PWM signal Encoder to the step counting sub-module and the signal prescaler. The signal prescaler is used for performing frequency division on the received reference PWM signal Encoder to output a first PM1 signal Encoder1. The signal prescaler supports and may be configured as a 2, 4 or 8 frequency divider. The clock output end of the signal prescaler is connected to the data input end of the speed detector, and is used for transmitting the first PWM signal Encoder1 to the speed detector, so as to output the first PWM signal Encoder1 of different frequencies to the speed detector. The first clock prescaler is used for controlling the frequency division of the received sampling clock Clk to obtain a first frequency division clock signal CLK_div1, and outputting the first frequency division clock signal CLK_div1 to the speed detector. In the embodiments, the frequency division coefficient of the first clock prescaler is configured as 16. The clock input end of the speed detector is connected to the clock output end of the first clock prescaler. Driven by the first frequency division clock signal Clk_div1, the speed detector counts the number of pulses of the first frequency division clock signal Clk_div1 in each pulse cycle of the first PWM signal Encoder1 by detecting the rising edge of the first PWM signal Encoder1. The speed detector uses the first frequency division clock signal Clk_div1 to sample and detect the first PWM signal Encoder1, performs median average processing on the number of pulses, and completes noise reduction processing of the number of pulses to reduce an impact of a noise signal on a pulse speed measurement value of the PWM signal PWM_IN to be processed, thereby providing the pulse speed signal with a higher precision for the external motor system, so as to provide a feedback signal of the rotation speed of the motor system. Because the speed signal output end of the speed detector serves as the output end of the PWM sampling and detection module, the pulse speed signal speed is output at the speed signal output end of the speed detector.

Figure 4:
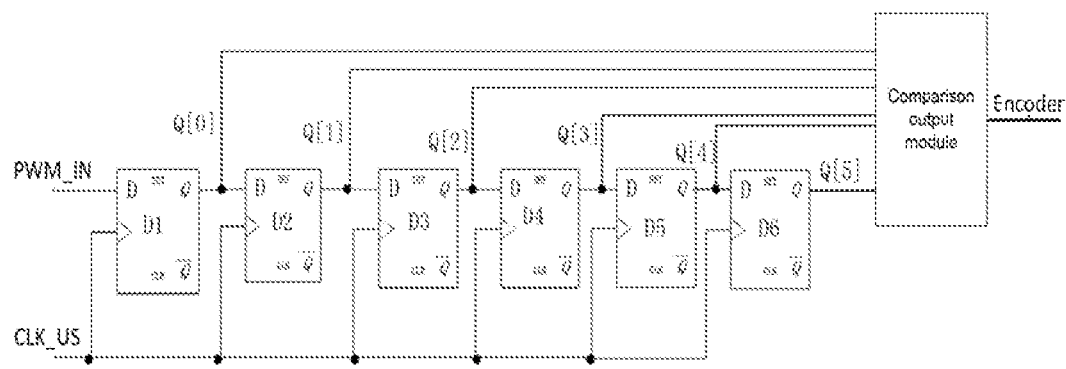
FIG. 4 is a circuit diagram of a filter according to an embodiment of the disclosure.

The filter includes a first preset number of D flip-flops and a comparison output module, the first preset number of D flip-flops form a shift register of the first preset number of bits. Clock ends of the first preset number of D flip-flops are connected to the clock input end of the filter. Output ends (Q) of the first preset number of D flip-flops are respectively connected to the first preset number of data input ends of the comparison output module. The data input end of the shift register serves as the signal input end of the filter. The data output end of the comparison output module serves as the signal output end of the filter. In the embodiments, the first preset number is set to 6. As shown in FIG. 4, the filter includes a first D flip-flop D1, a second D flip-flop D2, a third D flip-flop D3, a fourth D flip-flop D4, a fifth D flip-flop D5, a sixth D flip-flop D6 and a comparison output module. The six D flip-flops form a 6-bit shift register. The clock ends of the six D flip-flops are all connected to the high frequency clock signal CLK_US. The output end Q[0] of the first D flip-flop D1, the output end Q[1] of the second D flip-flop D2, the output end Q[2] of the third D flip-flop D3, the output end Q[3] of the fourth D flip-flop D4, the output end Q[4] of the fifth D flip-flop D5, and the output end Q[5] of the sixth D flip-flop D6 are respectively connected to six data input ends of the comparison output module. The data output end of the comparison output module is used for outputting the reference PWM signal Encoder, so as to ensure the stability of the PWM sampling and detection module.

As an embodiment, in the shift register, the output end of each D flip-flop, except the rightmost D flip-flop, is connected to the input end of the D flip-flop on the right, the output end of the rightmost D flip-flop is connected to a data input end of the comparison output module, and the input end of the leftmost D flip-flop serves as the data input end of the shift register. As shown in FIG. 4, when the data in the shift register shifts to the right bit by bit under the driving of the high frequency clock signal CLK US, the output end of each D flip-flop except the sixth D flip-flop D6 is connected to the input end D of a D flip-flop on the right. The input end D of the first D flip-flop D1 is connected to the PWM signal PWM_IN to be processed.

As another embodiment, in the shift register, the output end of each D flip-flop, except the leftmost D flip-flop, is connected to the input end of the D flip-flop on the left, and the output end of the leftmost D flip-flop is connected to a data input end of the comparison output module. When the data in the shift register shifts to the left bit by bit under the driving of the high frequency clock signal CLK_US, the output end Q of each D flip-flop, except the leftmost D flip-flop, is connected to the input end D of a D flip-flop on the left, and the input end D of the rightmost D flip-flop D1 is connected to the PWM signal PWM_IN to be processed. There is a delay time from that the rising edge of the high frequency clock signal CLK US is added to the flip-flop to that a new state of the output end is established steadily, so when the high frequency clock signal CLK US is simultaneously added to the first preset number of D flip-flops, each D flip-flop receives the original data in the D flip-flop on the left (or right), and then the data in the shift register is moved one bit to the right (or left) in turn.

The internal logical relationship of the comparison output module is that: when six data input ends of the comparison output module are all 0, that is, the 6-it signal Q[5:0] corresponding to the output ends of six flip-flops is equal to 0, the reference PWM signal Encoder output by the comparison output module is at low level; when six data input ends of the comparison output module are all 1, that is, the 6-bit signal Q[5:0] corresponding to the output ends of six flip-flops is equal to 6'b111111, the reference PWM signal Encoder output by the comparison output module is at high level. When there are both 0 and 1 in the first preset number of data input ends of the comparison output module, that is, Q[5:0]!=0 and Q[5:0]!=6'b111111, the reference PWM signal Encoder output by the comparison output module keeps the original level state unchanged.

Preferably, the first preset number is set to 6, so that the filter filters level jitter less than 5 clock cycles in the PWM signal PWM_IN to be processed as burrs. The clock cycle is a pulse cycle of the jitter level of the PWM signal PWM_IN to be processed. If the PWM signal PWM-IN to be processed has a pulse less than a certain width needing to be filtered, for example, when a jitter level pulse of 1 uS needs to be filtered, the filter may be composed of six D flip-flops with a delay time of 0.2 us and one comparison output module. The six D flip-flops with a delay time of 0.2 us form a 6-bit shift register. Before the jitter of the PWM signal PWM_IN to be processed is eliminated, the first preset number of input ends of the comparison output module is all 1 or all 0, and the reference PWM signal Encoder output by the comparison output module is at high level or low level correspondingly. During the period of eliminating the jitter of the PWM signal PWM_IN to be processed, both 1 and 0 exist at the first preset number of input ends of the comparison output module, the reference PWM signal Encoder output by the comparison output module keeps the original level state unchanged, and it can be determined that the signal in this period is a stable level signal. After the jitter of the PWM signal PWM_IN to be processed is eliminated, the first preset number of input ends of the comparison output module is all 1 or all 0, and the reference PWM signal Encoder output by the comparison output module is at high level or low level correspondingly. Thus, noise suppression processing may be performed on the input signal, and the level jitter less than 5 system clock cycles will be filtered out, which effectively reduces the higher harmonic energy of the input PWM signal, reduces the electromagnetic interference of the external motor system, and has a strong practicability.

The step counting sub-module includes a step counter and a direction register. The output end of the direction register is connected to an enabling end of the step counter. A counting output end of the step counter serves as the output end of the step counting sub-module, and the counting input end of the step counter serves as the data input end of the step counting sub-module. The direction register is used for outputting an addition and subtraction control signal. As a direction control signal of an "addition" or "subtraction" switch, the addition and subtraction control signal output by the directional register is connected to the step counter. If the addition and subtraction control signal is set to 1, the step counter is used for adding 1 to count in each pulse cycle. When the step counting sub-module detects a rising edge signal of the reference PWM signal Encoder, the step counter adds 1 to count from 0, and keeps the current count value in its built-in register, thus providing the external motor control system with a step number value based on the PWM signal PWM_IN to be processed, which represents a distance value obtained by rotation of the motor. After the count value of the step counter reaches the maximum value, the step counter overflows, generates a Tick pulse signal of a clock cycle, and the step counter adds 1 to count from 0 again. If the addition and subtraction control signal is set to 0, the step counter is used for subtracting 1 to count in each pulse cycle. When the step counting sub-module detects a rising edge signal of the reference PWM signal Encoder, the step counter subtracts 1 to count from a preset count value, and keeps the current count value in its built-in register, thus providing the external motor control system with the step number value based on the PWM signal PWM_IN to be processed, which represents the distance value obtained by rotation of the motor. After the count value of the step counter decreases to 0, the step counter overflows (that is, the current count value is 0), generates the Tick pulse signal of a clock cycle, and the step counter loads the preset count value and then subtracts 1 to count again.

Preferably, the step counter in the step counting sub-module is set to a 32-bit counter, and there is no need to perform symbol processing on the count value.

Figure 5:
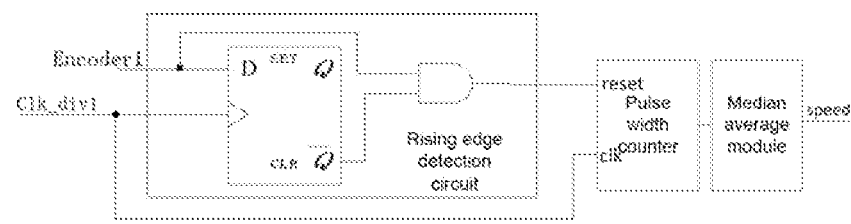
FIG. 5 is a circuit diagram of a speed detector according to an embodiment of the disclosure.

As shown in FIG. 5, the speed detector includes a rising edge detection circuit, a pulse width counter and a median average module, and is used for measuring the speed at which the motor rotates by measuring the cycle of the PWM signal PWM_IN to be processed, actually measuring a time width between the two rising edges of the PWM signal PWM_IN to be processed. The rising edge detection circuit includes a D flip-flop and an AND gate. The input end D of the D flip-flop is connected to an input end of the AND gate, and an inverse output end $\overline{Q}$ of the D flip-flop is connected to another input end of the AND gate. The clock end of the pulse width counter is connected to the clock end of the D flip-flop. The rising edge detection circuit is connected to a reset end of the pulse width counter through the output end of the AND gate. The data output end of the pulse width counter is connected to the data input end of the median average module. The output end of the median average module serves as the speed signal output end of the speed detector, and the input end of the rising edge detection circuit serves as the data input end of the speed detector. The input end D of the D flip-flop is used for receiving the first PWM signal Encoder1, and the first PWM signal Encoder1 is obtained by performing frequency division on the reference PWM signal Encoder. The clock end of the D flip-flop is used for receiving the first frequency division clock signal Clk_div1, and the first frequency division clock signal Clk_div1 is obtained by performing frequency division on the high frequency clock signal CLK_US. When the first PWM signal Encoder1 at the input end D of the D flip-flop is a low level signal at the first moment, the D flip-flop latches the low level signal of the first PWM signal Encoder1 at the first moment. After a clock cycle of the first frequency division clock signal Clk_div1, the inverse output end $\overline{Q}$ of the D flip-flop outputs a high level signal. If the input end D of the D flip-flop becomes a high level signal at the same moment, that is, the two input ends of the AND gate are high level signals at the same time, the rising edge detection circuit outputs the high level signal through the AND gate, at this point, the first PWM signal Encoder1 can be determined to be a rising edge signal and output to the reset end of the pulse width counter.

Figure 6:
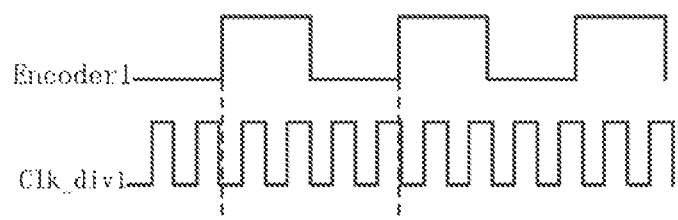
FIG. 6 is a schematic diagram of a sampling time sequence of a PWM signal pulse width for filtering to remove jitter according to an embodiment of the disclosure.

Driven the first frequency division clock signal Clk_div1, when the pulse width counter detects by sampling the rising edge signal of the first PWM signal Encoded, the rising edge signal is input as a reset signal for counting. For each input of the reset signal, the pulse width counter counts once according to the number of pulses of the first frequency division clock signal Clk_div1, so as to obtain the number of pulses of the corresponding first frequency division clock signal Clk_div1 in a pulse cycle of the first PWM signal Encoder1, As shown in FIG. 6, each time the pulse width counter detects a rising edge signal of the first PWM signal Encoded, the first frequency division clock signal Clk_div1 has spanned 4 clock cycles, and the pulse width counter adds 4 to the original count value as the current count value. Between the two rising edge signals of the first PWM signal Encoder1, the number of pulses of the first frequency division clock signal Clk_div1 is 4. The pulse width counter uses the clock cycles of four first frequency division clock signals Clk_div1 to sample the first PWM signal Encoder1 of one pulse cycle. In FIG. 6, the pulses of four first frequency division clock signal Clk_div4 framed by the dashed lines corresponding to the two rising edge signals of the first PWM signal Encoder1 are used as a standard for measuring the pulse width of the first PWM signal Encoder1, and then the speed at which the motor rotates corresponding to the PWM signal PWM_IN to be processed is measured. In the traditional art, the pulse width counter is driven by means of a clock edge, enabling signal to count, but there is a problem that clocks are out of sync. In the embodiments of the disclosure, the pulse width counter is driven by the rising edge detection circuit to count the pulse width of the first PWM signal Encoder1, in fact, the pulse width counter is driven by an edge detection enabling signal to count under the high frequency clock signal, which synchronizes the clock, and improves the sampling accuracy in the pulse cycle of the first PWM signal Encoder1.

Preferably, the power of a bit width value of the pulse width counter of 2 is greater than a ratio of the signal frequency of the clock input end of the pulse width counter to the signal frequency of the input end D of the D flip-flop. The maximum input frequency of the first frequency division clock signal Clk_div1 is 80 MHz. In the embodiments of the disclosure, the first frequency division clock signal Clk_div1 is 20 MHz. In order to realize the synchronous sampling of the first frequency division clock signal Clk_div1 and the rising edge signal of the first PWM signal Encoder1, there is a power relationship between the ratio of the first frequency division clock signal Clk_div1 and the first PWM signal Encoder1 and the bit width of the pulse width counter. When the clock frequency of the first PWM signal Encoder1 is 32 Hz, the ratio of the clock frequency of the first frequency division clock signal Clk_div1 to the clock frequency of the first PWM signal Encoder1 is 625000. Because the 20th power of 2 is greater than 625000, the bit width of the pulse width counter is set to 20 bits, so as to meet that the power of a bit width value of the pulse width counter of 2 is greater than the ratio of the clock frequency of the first frequency division clock signal Clk_div1 to the clock frequency of the first PWM signal Encoder1. Because the maximum clock frequency of the high frequency clock signal CLK_US is 80 MHz, which is 4 times 20 MHz, when a divided frequency of the high frequency clock signal CLK US obtains the first frequency division clock signal Clk_div1, and the clock frequency of the first PWM signal Encoder1 is kept as 32 Hz, it is needed to increase the bit width of the pulse width counter by 2 bits, set the bit width value to 22 bits, which is reserved and configured by the relevant register built in the pulse width counter, and load the corresponding bit width value on the premise of inputting the high frequency clock signal CLK US. The D flip-flop of the rising edge detection circuit receives the first frequency division clock signal Clk_div1 at a higher frequency, which may improve the efficiency of rising edge detection. Although jumping clutter cannot be filtered, the jitter of the first PWM signal Encoder1 has been eliminated, so the influence of clutter is not large.

The data output end of the pulse width counter is connected to the data input end of the median average module, and a signal of the number of pulses output by the pulse width counter is connected to the median average module. The median average module internally includes a counting and sampling register for storing the number of pulses output by the pulse width counter in real time. The median average module is connected to the pulse width counter, controls the comparison between the number of pulses and the second preset number of pulses stored in the counting and sampling register, and sorts them according to the comparison result and then selects the median value to represent the pulse speed signal speed. The second preset number of pulses is the number of pulses of the corresponding first frequency division clock signal Clk_div1, which has been sampled and detected, in the second preset number of pulse cycles in the first PWM signal Encoder1. In the embodiments of the disclosure, the median average module is beneficial to eliminate the influence of signal noise on the number of pulses and avoid the phenomenon that the measured pulse width of the first PWM signal Encoder1 is too large or too small, so as to collect a stable speed signal for the external motor system.

A chip is provided, which is integrated with the above-mentioned processing circuit. The processing circuit includes the PWM sampling and detection module and the PWM generation module. The PWM sampling and detection module captures the PWM signal PWM_IN to be processed which is input from the outside of the chip, receives the high frequency clock signal CLK US output by the system clock generator inside the chip, and outputs the pulse speed signal speed based on the PWM signal to be processed to the outside of the chip. The PWM generation module is used for receiving the sampling clock Clk output by the system clock generator inside the chip, and outputting the PWM output signal PWM_OUT with a controllable duty ratio based on the sampling clock Clk. The PWM sampling and detection module and the PWM generation module are jointly connected to the sampling clock Clk. Compared with the traditional art, the speed detector is integrated inside the chip, and the chip is used for providing a pulse sampling speed for the external motor system. Compared with the traditional art, the above-mentioned PWM generation circuit is integrated inside the chip, which outputs the PWM signal with a controllable duty ratio on the premise of less software resources.

The embodiments of the device described above are only schematic. The units described as separate parts may be or may not be separate physically. The part shown as the unit may be or may not be a physical unit, that is to say, it may be in a place or distributed on multiple network units. It is possible to select, according to the actual needs, part or all of the modules to achieve the objective of the solutions in the disclosure. Those of ordinary skill in the art may understand and implement without creative work.

What is claimed is:

1. A Pulse Width Modulation (PWM) generation circuit, used for controlling a rotation speed of an external motor system, wherein the PWM generation circuit comprises a second clock prescaler and a PWM signal generator; a frequency division output end of the second clock prescaler is connected to a data input end of the PWM signal generator; the PWM signal generator comprises an output frequency divider and a comparator; a comparison input end of the comparator is connected to a clock output end of the output frequency divider, and the other comparison input end of the comparator is connected to a reference constant voltage source; an input end of the output frequency divider serves as the data input end of the PWM signal generator, and a signal output end of the comparator serves as a comparison result output end of the PWM generation circuit.

2. The PWM generation circuit according to claim 1, wherein a frequency division coefficient of the second clock prescaler is configurable.

3. A Pulse Width Modulation (PWM) signal processing circuit, used for adjusting an external motor system, wherein the processing circuit comprises a PWM sampling and detection module and a PWM generation module; a clock input end of the PWM sampling and detection module is connected to the clock input end of the PWM generation module;

the PWM sampling and detection module comprises a filter, a step counting sub-module, a signal prescaler, a speed detector and a first clock prescaler; wherein a signal input end of the filter serves as a PWM signal input end of the PWM sampling and detection module; the connection relationship in the PWM sampling and detection module is: a signal output end of the filter is connected to both a data input end of the step counting sub-module and the clock input end of the signal prescaler, the clock output end of the signal prescaler is connected to the data input end of the speed detector, the clock input end of the speed detector is connected to the clock output end of the first clock prescaler, and a speed signal output end of the speed detector serves as the output end of the PWM sampling and detection module;

the PWM generation module comprises a PWM generation circuit according to claim 1, wherein the comparison result output end of the PWM generation circuit serves as the comparison result output end of the PWM generation module.

4. The processing circuit according to claim 3, wherein the filter comprises a first preset number of D flip-flops and a comparison output module; the first preset number of D flip-flops form a shift register of the first preset number of bits; clock ends of the first preset number of D flip-flops are connected to the clock input end of the filter; output ends (Q) of the first preset number of D flip-flops are respectively connected to the first preset number of data input ends of the comparison output module; the data input end of the shift register serves as the signal input end of the filter; and the data output end of the comparison output module serves as the signal output end of the filter.

5. The processing circuit according to claim 4, wherein in the shift register, the output end of each D flip-flop, except the rightmost D flip-flop, is connected to the input end of the D flip-flop on the right, the output end of the rightmost D flip-flop is connected to a data input end of the comparison output module, and the input end of the leftmost D flip-flop serves as the data input end of the shift register.

6. The processing circuit according to claim 4, wherein in the shift register, the output end of each D flip-flop, except the leftmost D flip-flop, is connected to the input end of the D flip-flop on the left, the output end of the leftmost D flip-flop is connected to a data input end of the comparison output module, and the input end of the rightmost D flip-flop serves as the data input end of the shift register.

7. The processing circuit according to claim 4, wherein the first preset number is set to 6, so that the filter filters level jitter less than 5 clock cycles in an input PWM signal to be processed (PWM_IN) as burrs; the clock cycle is a pulse cycle of the jitter level of the PWM signal to be processed (PWM_IN).

8. The processing circuit according to claim 3, wherein the step counting sub-module comprises a step counter and a direction register; the output end of the direction register is connected to an enabling end of the step counter; a counting output end of the step counter serves as the output end of the step counting sub-module; and the counting input end of the step counter serves as the data input end of the step counting sub-module.

9. The processing circuit according to claim 3, wherein the speed detector comprises a rising edge detection circuit, a pulse width counter and a median average module;

the rising edge detection circuit comprises a D flip-flop and an AND gate, wherein the input end (D) of the D flip-flop is connected to an input end of the AND gate, and an inverse output end $\overline{Q}$ of the D flip-flop is connected to another input end of the AND gate; the clock end of the pulse width counter is connected to the clock end of the D flip-flop; the rising edge detection circuit is connected to a reset end of the pulse width counter through the output end of the AND gate; the data output end of the pulse width counter is connected to the data input end of the median average module; the output end of the median average module serves as the speed signal output end of the speed detector; and the input end of the rising edge detection circuit serves as the data input end of the speed detector.

10. The processing circuit according to claim 9, wherein the power of a bit width value of the pulse width counter of 2 is greater than a ratio of the signal frequency of the clock input end of the pulse width counter to the signal frequency of the input end (D) of the D flip-flop.

11. A chip, comprising a processing circuit according to claim 3.

12. The chip according to claim 11, wherein the filter comprises a first preset number of D flip-flops and a comparison output module; the first preset number of D flip-flops form a shift register of the first preset number of bits; clock ends of the first preset number of D flip-flops are connected to the clock input end of the filter; output ends (Q) of the first preset number of D flip-flops are respectively connected to the first preset number of data input ends of the comparison output module; the data input end of the shift register serves as the signal input end of the filter; and the data output end of the comparison output module serves as the signal output end of the filter.

13. The chip according to claim 11, wherein in the shift register, the output end of each D flip-flop, except the rightmost D flip-flop, is connected to the input end of the D flip-flop on the right, the output end of the rightmost D flip-flop is connected to a data input end of the comparison output module, and the input end of the leftmost D flip-flop serves as the data input end of the shift register.

14. The chip according to claim 11, wherein in the shift register, the output end of each D flip-flop, except the leftmost D flip-flop, is connected to the input end of the D flip-flop on the left, the output end of the leftmost D flip-flop is connected to a data input end of the comparison output module, and the input end of the rightmost D flip-flop serves as the data input end of the shift register.

15. The chip according to claim 11, wherein the first preset number is set to 6, so that the filter filters level jitter less than 5 clock cycles in an input PWM signal to be processed (PWM_IN) as burrs; the clock cycle is a pulse cycle of the jitter level of the PWM signal to be processed (PWM_IN).

16. The chip according to claim 11, wherein the step counting sub-module comprises a step counter and a direction register; the output end of the direction register is connected to an enabling end of the step counter; a counting output end of the step counter serves as the output end of the step counting sub-module; and the counting input end of the step counter serves as the data input end of the step counting sub-module.

17. The chip according to claim 11, wherein the speed detector comprises a rising edge detection circuit, a pulse width counter and a median average module;

the rising edge detection circuit comprises a D flip-flop and an AND gate, wherein the input end (D) of the D flip-flop is connected to an input end of the AND gate, and an inverse output end $\overline{Q}$ of the D flip-flop is connected to another input end of the AND gate, the clock end of the pulse width counter is connected to the clock end of the D flip-flop; the rising edge detection circuit is connected to a reset end of the pulse width counter through the output end of the AND gate; the data output end of the pulse width counter is connected to the data input end of the median average module; the output end of the median average module serves as the speed signal output end of the speed detector; and the input end of the rising edge detection circuit serves as the data input end of the speed detector.

18. The chip according to claim 17, wherein the power of a bit width value of the pulse width counter of 2 is greater than a ratio of the signal frequency of the clock input end of the pulse width counter to the signal frequency of the input end (D) of the D flip-flop.

\* \* \* \* \*